United States Patent
Zhang et al.

(10) Patent No.: US 9,996,412 B2
(45) Date of Patent: *Jun. 12, 2018

(54) ENHANCED CHIP-KILL SCHEMES BY USING SUB-TRUNK CRC

(71) Applicant: SK hynix Inc., Gyeonggi-do, OT (KR)

(72) Inventors: Fan Zhang, Fremont, CA (US); June Lee, Sunnyvale, CA (US); Yu Cai, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 111 days.

This patent is subject to a terminal disclaimer.

(21) Appl. No.: 15/184,845

(22) Filed: Jun. 16, 2016

(65) Prior Publication Data

US 2016/0373132 A1 Dec. 22, 2016

Related U.S. Application Data

(60) Provisional application No. 62/180,515, filed on Jun. 16, 2015.

(51) Int. Cl.
*H03M 13/00* (2006.01)
*G06F 11/10* (2006.01)
*H03M 13/05* (2006.01)
*H03M 13/09* (2006.01)

(52) U.S. Cl.
CPC .......... *G06F 11/10* (2013.01); *H03M 13/05* (2013.01); *H03M 13/09* (2013.01)

(58) Field of Classification Search
CPC ........ G06F 11/10; H03M 13/05; H03M 13/09
See application file for complete search history.

(56) References Cited

U.S. PATENT DOCUMENTS

| | | |
|---|---|---|
| 7,307,902 B2 | 12/2007 | Thayer |
| 8,291,290 B1 | 10/2012 | Burd et al. |
| 8,640,002 B1 * | 1/2014 | Varanasi ................. G06F 11/10 714/758 |
| 9,236,886 B1 * | 1/2016 | Zhu ....................... H03M 13/15 |

* cited by examiner

*Primary Examiner* — Guy Lamarre
(74) *Attorney, Agent, or Firm* — IP & T Group LLP

(57) ABSTRACT

Memory systems may include a memory storage, and a controller suitable for, receiving a plurality of codewords, each codeword including a user bits portion divided into a number of sub-trunks, determining whether a codeword in the plurality of codewords is decidable, identifying a location of an erroneous sub-trunk in a codeword determined to be undecodable, and recovering the erroneous sub-trunk by summing sub-trunks of other codewords that have a location in their respective codewords that is the same as the location of the erroneous sub-trunk.

18 Claims, 8 Drawing Sheets

US 9,996,412 B2

ENHANCED CHIP-KILL SCHEMES BY USING SUB-TRUNK CRC

CROSS-REFERENCE TO RELATED APPLICATIONS

This application claims the benefit of U.S. Provisional Application No. 62/180,515 filed Jun. 16, 2015, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

In memory devices, chip-kill schemes have been implemented. There exists a need for improved chip-kill schemes that can recover data at a higher rate.

SUMMARY

Aspects of the invention include memory systems. The memory systems may include a memory storage, and a controller suitable for, receiving a plurality of codewords, each codeword including a user bits portion divided into a number of sub-trunks, determining whether a codeword in the plurality of codewords is decodable, identifying a location of an erroneous sub-trunk in a codeword determined to be undecodable, and recovering the erroneous sub-trunk by summing sub-trunks of other codewords that have a location in their respective codewords that is the same as the location of the erroneous sub-trunk.

Further aspects of the invention include methods. The methods may include receiving, with a controller, a plurality of codewords, each codeword including a user bits portion divided into a number of sub-trunks, determining, with the controller, whether a codeword in the plurality of codewords is decodable, identifying, with the controller, a location of an erroneous sub-trunk in a codeword determined to be undecodable, and recovering, with the controller, the erroneous sub-trunk by summing sub-trunks of other codewords that have a location in their respective codewords that is the same as the location of the erroneous sub-trunk.

Additional aspects of the invention include memory devices. The memory devices may include a memory storage, and a controller configured to receive a plurality of codewords, each codeword including a user bits portion divided into a number of sub-trunks, determine whether a codeword in the plurality of codewords is decodable, identify a location of an erroneous sub-trunk in a codeword determined to be undecodable, and recover the erroneous sub-trunk by summing sub-trunks of other codewords that have a location in their respective codewords that is the same as the location of the erroneous sub-trunk.

DETAILED DESCRIPTION

Figure 1:
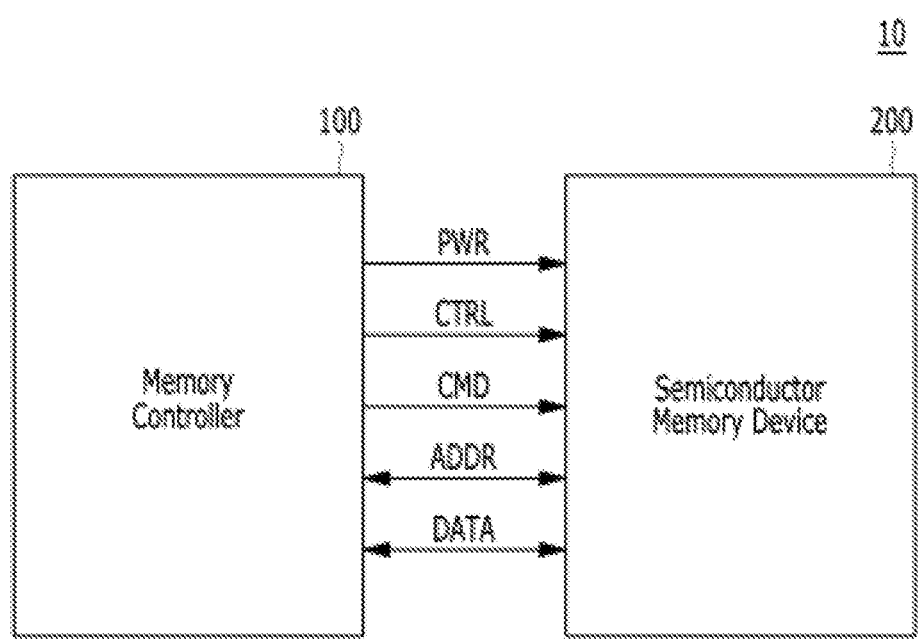
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
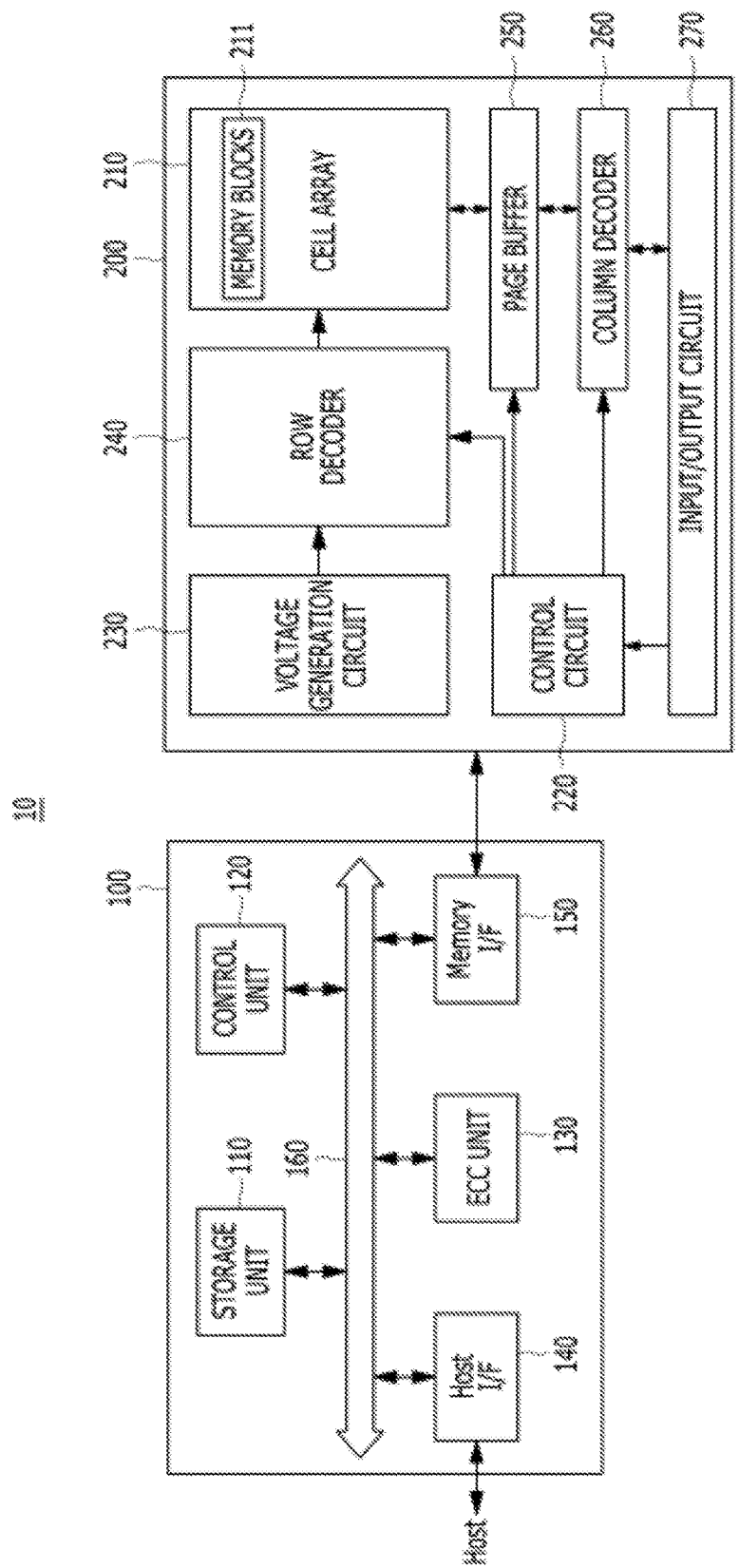
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform: a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
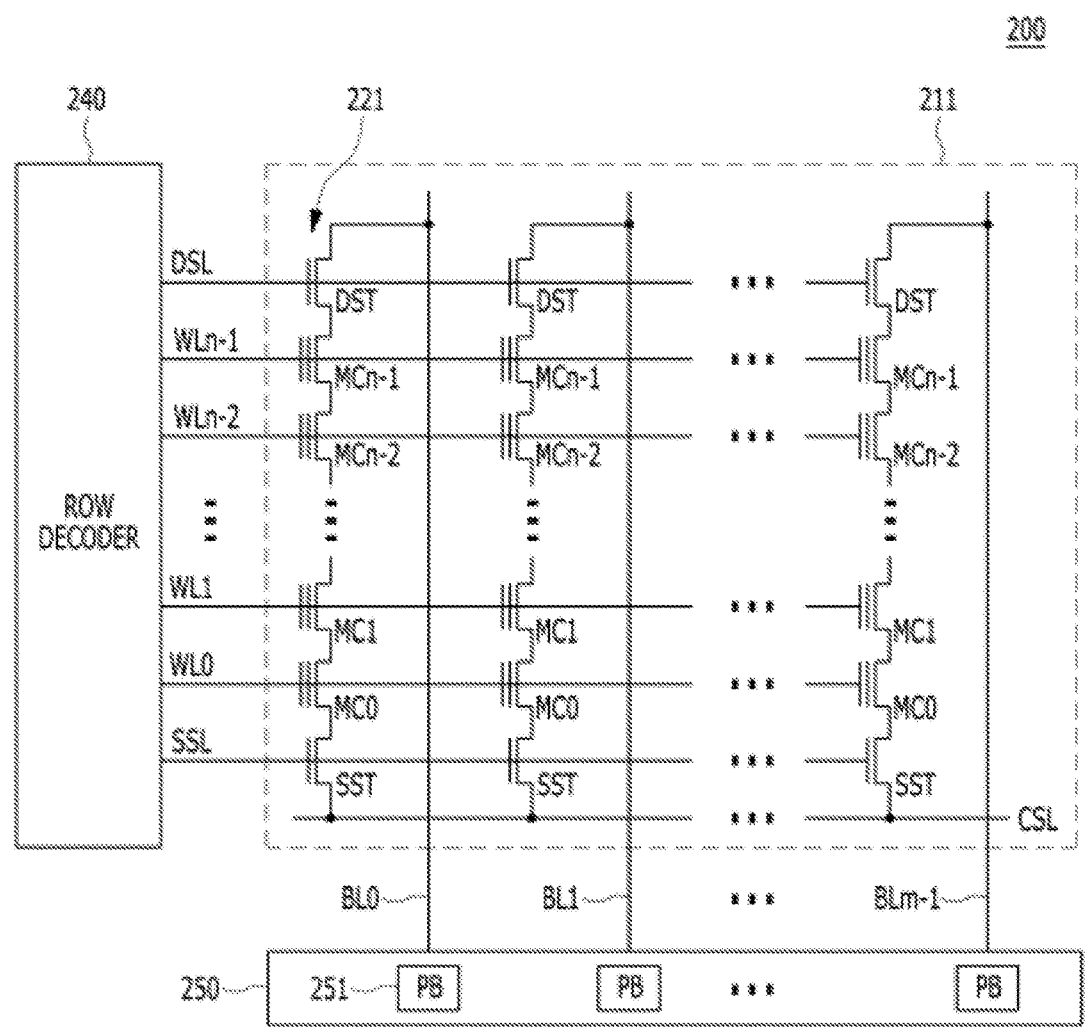
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
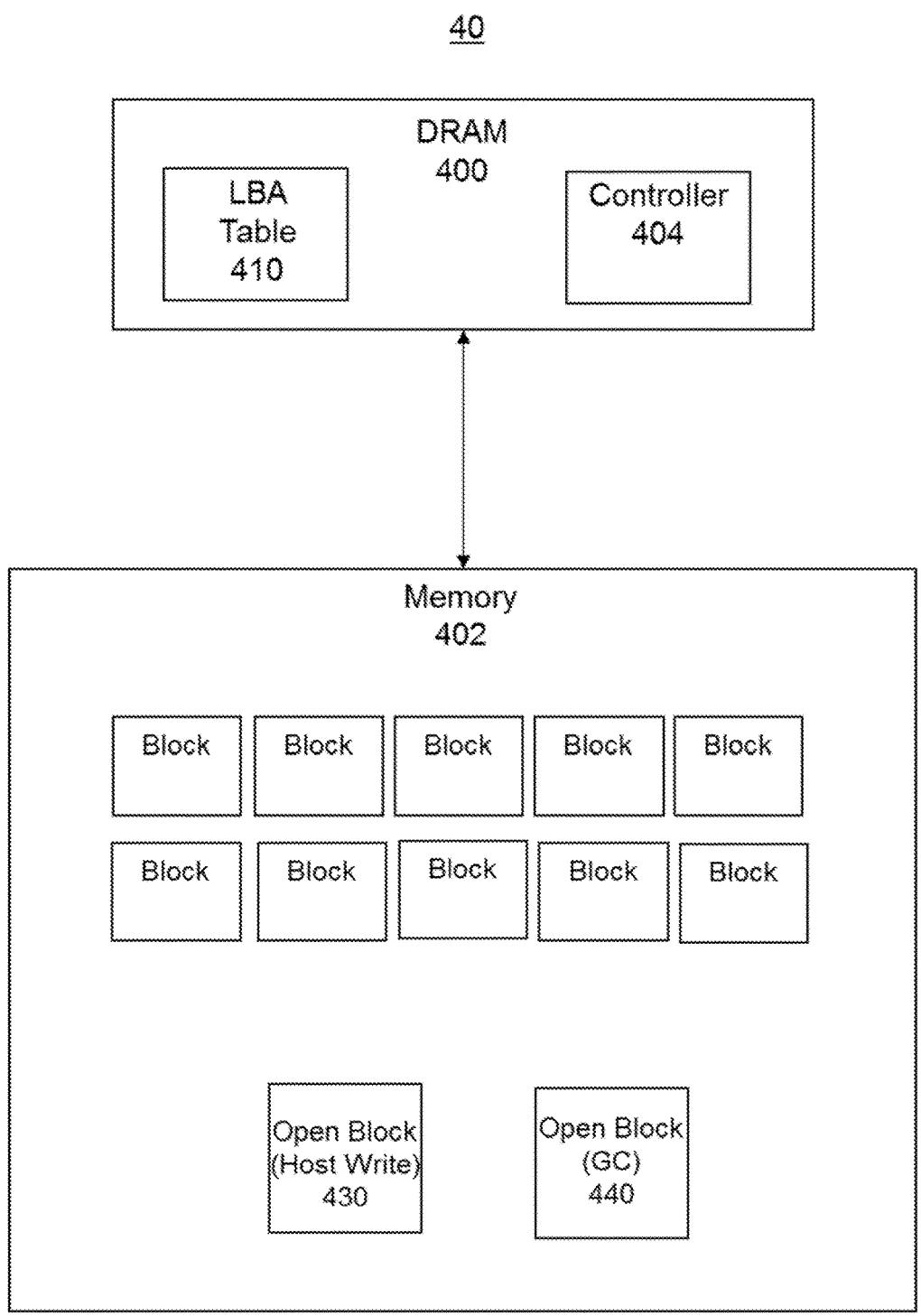
FIG. 4 is a diagram of an example memory system according to aspects of the invention.

FIG. 4 is a diagram of a memory system 40 in accordance with embodiments of the invention. The memory system 40 may include a DRAM 400 and a memory portion/storage 402. The DRAM 400 may include a controller 404 (such as those described above) and an LBA table 410. The controller 404 may be configured to carry out the functionality of the methods, processes, systems, and devices disclosed herein. The memory 402 may include a plurality of memory blocks, an open block for host writes 430, and an open block for garbage collection 440. The DRAM 400 and the memory 402 may be configured to be in communication.

Chip-kill techniques have been implemented as a last error recovery resort to ensure data integrity. In other words, any error which cannot be corrected by chip-kill will lead to user data loss from an SSD drive perspective, or the reliability of our SSD drive is determined by the error correction capability of chip-kill scheme. A modified chip-kill scheme is disclosed herein that achieves improved error correction capability without any extra NAND/memory reads and with only a slight increase of latency and power.

Previous chip-kill schemes are basically a single parity check code which can protect any 1 node failure in a stripe. In the write path, it takes k trunks of ECC encoded information and sums them together to generate a parity trunk. A trunk can be a codeword, or multiple codewords (for illustration purposes, it is assumed that each trunk contains at least one codeword). The k+1 trucks of data, which is called a data stripe, is then written into the memory/NAND. In the read path, if a trunk cannot be successfully decoded, the controller will read all other trucks of data on the same stripe. If all other trunks of data can be successfully decoded, the uncorrectable trunk can be recovered by summing up all the other trunks of data. If there are two or more uncorrectable trunks of data in a stripe, the recovery algorithm will declare a failure. The chip-kill scheme is also called (k, 1) chip-kill scheme where 1 parity trunk is generated in every k data trunks. Any single trunk error can be recovered by XOR-ing other k trunks of data.

Traditional chip-kill schemes can only correct 1 truck error by using 1 parity trunk. When two or more trunks are in error, the invention disclosed herein uses sub-trunk CRC in the error trunks to identify the locations of the errors and/or the location of the erroneous sub-trunks. By knowing the location of the errors, some errors may be corrected by XOR-ing the correct bits on other trunks and then applying another round of decoding to the error trunks. The disclosed scheme can correct more than 1 trunk failure by having only 1 parity trunk.

Figure 5:
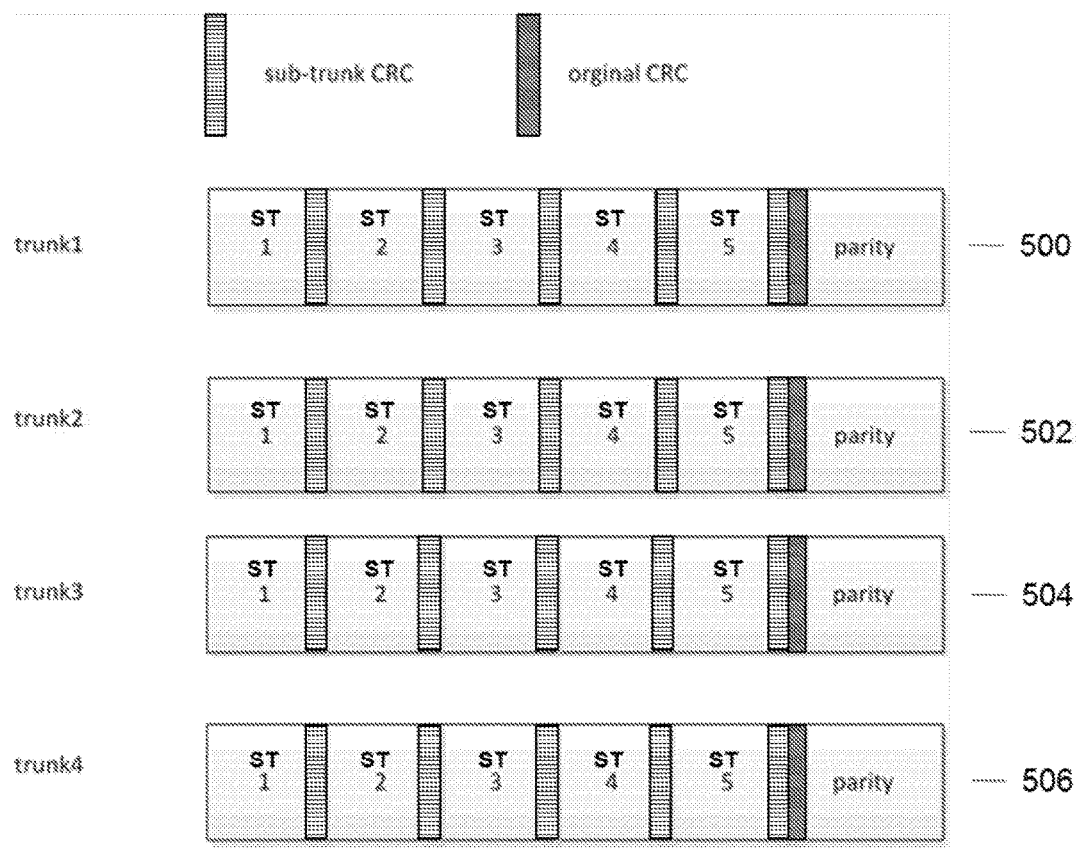
FIG. 5 is a diagram of trunks and sub-trunks according to aspects of the invention.

Referring to FIG. 5, a format of a plurality of trunks (500, 502, 504, and 506) for effectuating the invention is shown. Each trunk includes a plurality of sub-trunks (ST). In new codeword format, each user portion is divided into t sub-trunks (ST). In this example, t is chosen as 5. In the write path, a sub-trunk cyclic redundancy check (CRC) is inserted at the end of every sub-trunk. All sub-trunks with sub-trunk CRCs are then protected by overall CRC bits (shown as "original CRC). Then, the user bits portion with sub-trunk CRC bits and overall CRC bits are encoded by ECC encoder to get parity bits. There is no CRC on parity portion. The size of sub-trunk CRC can be chosen as 1 byte to 4 bytes according to the error recovery capability. The overall CRC may have 4 bytes. The format shown may have a storage overhead of 0.1% to 0.2% for the sub-trunk CRC bits, which is generally considered to be small.

Figure 6:
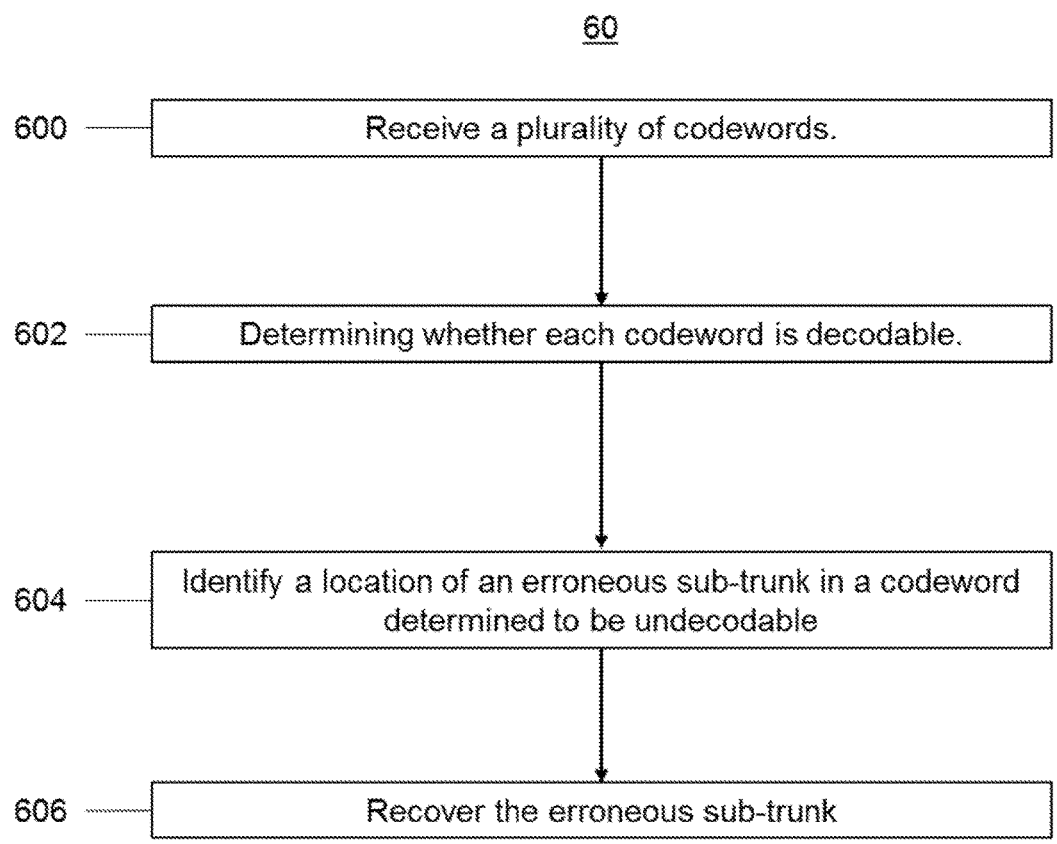
FIG. 6 is a flowchart of steps in a method for data recovery in accordance with aspects of the invention.
Figure 7:
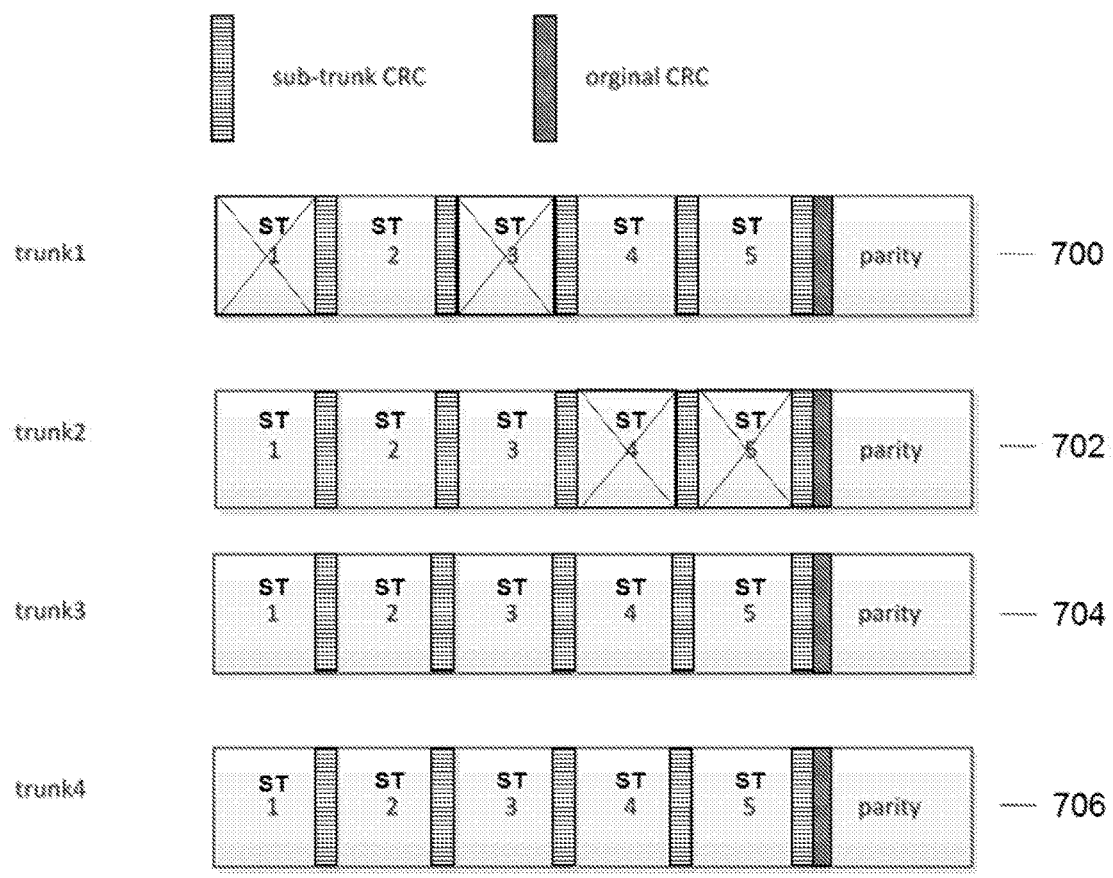
FIG. 7 is a diagram of trunks and sub-trunks containing errors according to aspects of the invention.
Figure 8:
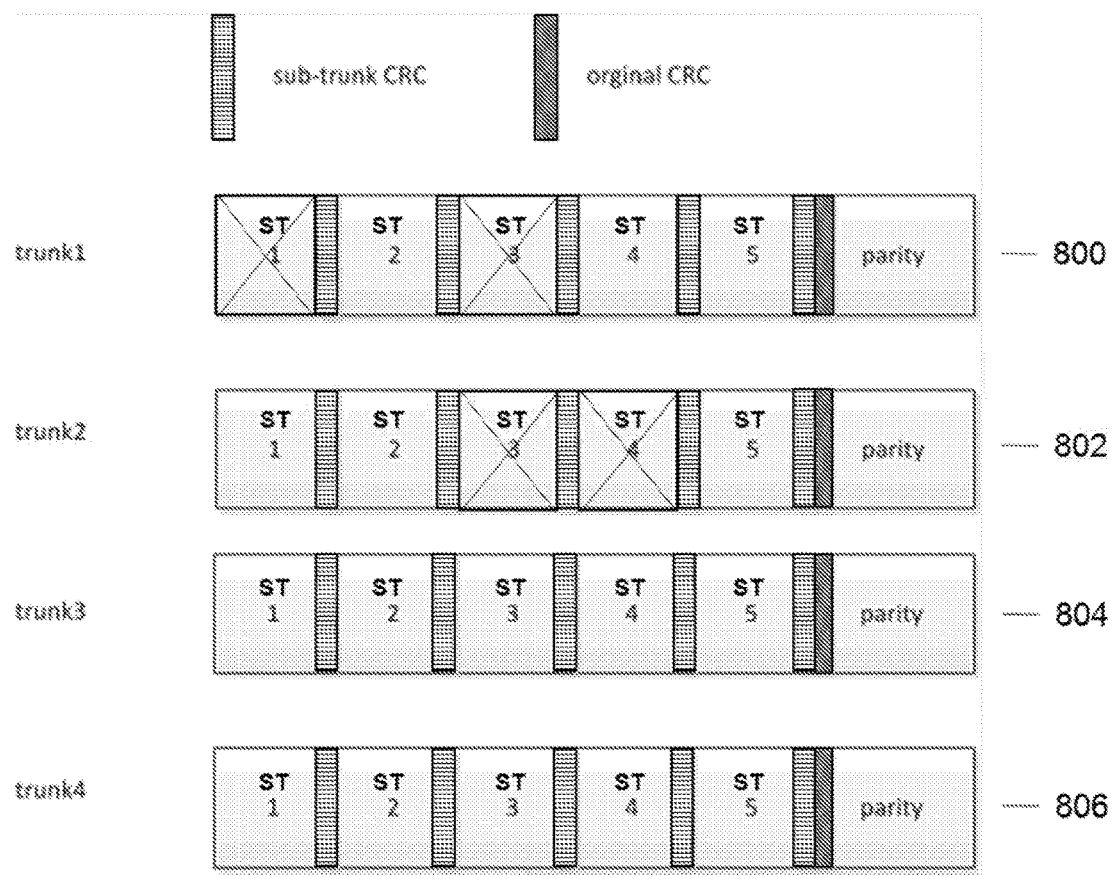
FIG. 8 is a diagram of trunks and sub-trunks containing errors according to aspects of the invention.

Referring next to FIG. 6, a flowchart 60 of steps for decoding erroneous codewords. Reference will also be made to FIGS. 7 and 8, which show diagrams of trunks with error locations.

At step 600, a plurality of codewords are received (e.g., by the controller), or alternatively, generated by the controller. At step 602, the controller may determine whether each codeword (e.g., each trunk) is decodable. For example, at FIG. 7, trunks 704 and 706 are decodable because there are no erroneous sub-trunks in each of these trunks. However, trunks 700 and 702 are not decodable because each trunk contains at least one erroneous trunk (indicated by the X). Similarly, in FIG. 8, trunks 804 and 806 are decodable, while trunks 800 and 802 are not.

At step 604, the controller may identify the location of an erroneous sub-trunk in a codeword determined to be undecodable. In trunk 700, the location of the erroneous sub-trunks is ST 1 and ST 3. In trunk 702, the location of the erroneous sub-trunks is ST 4 and ST 5. In trunk 800, the location of the erroneous sub-trunks is ST 1 and ST 3. In trunk 802, the location of the erroneous sub-trunks is ST 3 and ST 4.

At step 606, the erroneous sub-trunks may be recovered. If there are two undecodable codewords in a stripe as shown in FIGS. 7 and 8, the controller may be configured to first check which sub-trunks of user data in the erroneous codewords are in error by looking at the sub-trunk CRC bits.

In FIG. 7, the location of the erroneous sub-trunks in two undecodable codewords do not overlap. Thus, the erroneous sub-trunks may be recovered by summing over all remaining sub-trunks from the successfully decoded codewords. In FIG. 7, trunk 700 and 702 are undecodable. By looking at the sub-trunk CRC bits, it is known that sub-trunk 1 and 3 of codeword 700 are in error, and sub-trunk 4 and 5 of codeword 702 are in error after decoding. Instead of declaring chip-kill failure, the controller may be configured to sum sub-trunk 1 of codeword 702, 704 and 706 to recover sub-trunk 1 of codeword 700. In the similar manner, the other 3 sub-trunk errors can also be recovered by summing up remaining sub-trunks which are error-free. Thus, the erroneous sub-trunk may be recovered by summing the other sub-trunks in decodable codewords with a location in their respective codewords that is the same as the location of the erroneous sub-trunk in the undecodable codeword.

In FIG. 8, the location of the erroneous sub-trunks in undecodable codewords 800 and 802 partially overlap (at location ST 3). In this example, the controller may be configured to first recover the errors in the non-overlapping sub-trunks by summing the remaining sub-trunks in the other codewords and then perform hard decoding using the partially repaired codewords. For example, in FIG. 8, sub-trunk 1 and 3 of codeword 800 are in error, and sub-trunk 3 and 4 of codeword 802 are in error after decoding. In this case, the controller may be configured to first partially recover the undecodable codewords by recovering sub-trunk 1 of codeword 800 and sub-trunk 4 of codeword 802 so that codeword 800 only has sub-trunk 3 in error, and codeword 802 only has sub-trunk 3 in error. The controller may then perform hard decoding of codeword 800 and codeword 800 which may succeed. Additionally, the error recovery process may be done iteratively. For example, if codeword 800 is decoded successfully, but codeword 802 still cannot be decoded, the now correct sub-trunk 3 in codeword 800 may be used to recover sub-trunk 3 in codeword 802.

If all sub-trunks in error are all completely overlapped between erroneous codewords, a chip-kill error may be declared.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A memory system, comprising:
   a memory storage; and
   a controller suitable for:
   receiving a plurality of codewords, each codeword including a user bits portion divided into a number of sub-trunks;
   determining whether a codeword in the plurality of codewords is decodable;
   identifying a location of an erroneous sub-trunk in a codeword determined to be undecodable; and
   recovering the erroneous sub-trunk by summing sub-trunks of other codewords without any extra NAND read, wherein the other codewords are successfully decoded and have a location in their respective codewords that is the same as the location of the erroneous sub-trunk, and more than one erroneous sub-trunk are corrected with only one parity trunk generated in each of the codewords.

2. The memory system of claim 1, wherein a cyclic redundancy check (CRC) bit is inserted at an end of each sub-trunk.

3. The memory system of claim 2, wherein overall CRC bits are taken over each sub-trunk and each sub-trunk CRC bit in each codeword of the plurality of codewords.

4. The memory system of claim 3, wherein the sub-trunk CRC bits and overall CRC bits are encoded to obtain parity bits.

5. The memory system of claim 1, wherein when the controller determines at least two codewords are undecodable and the location of the erroneous sub-trunk in each of the at least two codewords overlaps, the controller is further suitable for partially repairing each of the at least two codewords.

6. The memory system of claim 5, wherein the controller is further suitable for performing hard decoding with the partially repaired codewords.

7. A method, comprising:
receiving, with a controller, a plurality of codewords, each codeword including a user bits portion divided into a number of sub-trunks;
determining, with the controller, whether a codeword in the plurality of codewords is decodable;
identifying, with the controller, a location of an erroneous sub-trunk in a codeword determined to be undecodable; and
recovering, with the controller, the erroneous sub-trunk by summing sub-trunks of other codewords without any extra NAND read, wherein the other codewords are successfully decoded and have a location in their respective codewords that is the same as the location of the erroneous sub-trunk, and more than one erroneous sub-trunk are corrected with only one parity trunk generated in each of the codewords.

8. The method of claim 7, wherein a cyclic redundancy check (CRC) bit is inserted at an end of each sub-trunk.

9. The method of claim 8, wherein overall CRC bits are taken over each sub-trunk and each sub-trunk CRC bit in each codeword of the plurality of codewords.

10. The method of claim 9, wherein the sub-trunk CRC bits and overall CRC bits are encoded to obtain parity bits.

11. The method of claim 7, wherein when the controller determines at least two codewords are undecodable and the location of the erroneous sub-trunk in each of the at least two codewords overlaps, the method further comprises partially repairing each of the at least two codewords.

12. The method of claim 11, further comprising performing hard decoding with the partially repaired codewords.

13. A memory device, comprising:
a memory storage; and
a controller configured to:
receive a plurality of codewords, each codeword including a user bits portion divided into a number of sub-trunks;
determine whether a codeword in the plurality of codewords is decodable;
identify a location of an erroneous sub-trunk in a codeword determined to be undecodable; and
recover the erroneous sub-trunk by summing sub-trunks of other codewords without any extra NAND read, wherein the other codewords are successfully decoded and have a location in their respective codewords that is the same as the location of the erroneous sub-trunk, and more than one erroneous sub-trunk are corrected with only one parity trunk generated in each of the codewords.

14. The memory device of claim 13, wherein a cyclic redundancy check (CRC) bit is inserted at an end of each sub-trunk.

15. The memory device of claim 14, wherein overall CRC bits are taken over each sub-trunk and each sub-trunk CRC bit in each codeword of the plurality of codewords.

16. The memory device of claim 15, wherein the sub-trunk CRC bits and overall CRC bits are encoded to obtain parity bits.

17. The memory device of claim 13, wherein when the controller determines at least two codewords are undecodable and the location of the erroneous sub-trunk in each of the at least two codewords overlaps, the controller is further configured to partially repair each of the at least two codewords.

18. The memory device of claim 17, wherein the controller is further configured to perform hard decoding with the partially repaired codewords.

* * * * *